(12) United States Patent
Liu

(10) Patent No.: US 12,100,593 B2
(45) Date of Patent: Sep. 24, 2024

(54) METHOD FOR FORMING SELF-ALIGNED DOUBLE PATTERN AND SEMICONDUCTOR STRUCTURES

(71) Applicant: CHANGXIN MEMORY TECHNOLOGIES, INC., Hefei (CN)

(72) Inventor: Zhongming Liu, Hefei (CN)

(73) Assignee: CHANGXIN MEMORY TECHNOLOGIES, INC., Hefei (CN)

(*) Notice: Subject to any disclaimer, the term of this patent is extended or adjusted under 35 U.S.C. 154(b) by 587 days.

(21) Appl. No.: 17/476,738

(22) Filed: Sep. 16, 2021

(65) Prior Publication Data

US 2022/0013360 A1    Jan. 13, 2022

Related U.S. Application Data

(63) Continuation of application No. PCT/CN2021/076797, filed on Feb. 19, 2021.

(30) Foreign Application Priority Data

Jul. 10, 2020 (CN) .......................... 202010663754.0

(51) Int. Cl.
H01L 21/033 (2006.01)

(52) U.S. Cl.
CPC ...... H01L 21/0338 (2013.01); H01L 21/0335 (2013.01); H01L 21/0337 (2013.01)

(58) Field of Classification Search
CPC ............. H01L 21/0338; H01L 21/0335; H01L 21/0337; H01L 21/311; H01L 21/3086;
(Continued)

(56) References Cited

U.S. PATENT DOCUMENTS 6,194,283 B1   2/2001  Gardner et al.
9,437,447 B2   9/2016  Devilliers
(Continued)

FOREIGN PATENT DOCUMENTS

CN   101958244 A   1/2011
CN   101615579 B   4/2012
(Continued)

OTHER PUBLICATIONS

English translation of the Written Opinion of the International Search Authority in the corresponding international application No. PCT/CN2021/076797, mailed on May 17, 2021.
(Continued)

*Primary Examiner* — Herve-Louis Y Assouman
*Assistant Examiner* — Linda J. Fleck
(74) *Attorney, Agent, or Firm* — Kilpatrick Townsend & Stockton LLP

(57) ABSTRACT

A method for forming a self-aligned double pattern and semiconductor structures are provided. The method for forming a self-aligned double pattern includes the following steps: providing a substrate; sequentially forming a first mask layer, a second mask layer and a third mask layer on an upper surface of the substrate, and etching downwards from an upper surface of the third mask layer in a direction perpendicular to the upper surface of the substrate until a first trench exposing an upper surface of the first mask layer is formed; removing the third mask layer, and partially removing the first mask layer, so as to deepen the first trench; forming a spacer layer on an inner wall of the first trench, and filling the first trench with a fourth mask layer; and partially removing the spacer layer to form a second trench exposing the substrate.

15 Claims, 5 Drawing Sheets

(58) Field of Classification Search
CPC ........... H01L 21/0332; H01L 21/31105; H01L 21/31144; H01L 29/66227
See application file for complete search history.

(56) References Cited

U.S. PATENT DOCUMENTS

| | | | |
|---|---|---|---|
| 9,741,582 B2 | 8/2017 | Lupo | |
| 10,923,363 B1* | 2/2021 | Das | H01L 21/32139 |
| 2008/0014752 A1 | 1/2008 | Cha et al. | |
| 2008/0090418 A1 | 4/2008 | Jeon et al. | |
| 2008/0131793 A1 | 6/2008 | Lee et al. | |
| 2013/0264622 A1* | 10/2013 | Lin | H10B 69/00 257/314 |
| 2015/0243519 A1* | 8/2015 | deVilliers | H01L 21/31111 438/692 |
| 2018/0350599 A1 | 12/2018 | Burns et al. | |
| 2019/0139824 A1 | 5/2019 | Chang et al. | |

FOREIGN PATENT DOCUMENTS

| | | |
|---|---|---|
| CN | 101866848 B | 5/2012 |
| CN | 103594336 A | 2/2014 |
| CN | 103794475 A | 5/2014 |
| CN | 103794476 A | 5/2014 |
| CN | 104733315 A | 6/2015 |
| CN | 110335813 A | 10/2019 |

OTHER PUBLICATIONS

Supplementary European Search Report in the European application No. 21838689.4, mailed on Nov. 24, 2023. 9 pages.
International Search Report as cited in PCT Application No. PCT/CN2021/076797 mailed May 17, 2021, 4 pages.
State Intellectual Property Office of the People's Republic of China, Office Action and Search Report Issued in Application No. 202010663754.0, May 31, 2024, 8 pages.

* cited by examiner

US 12,100,593 B2

METHOD FOR FORMING SELF-ALIGNED DOUBLE PATTERN AND SEMICONDUCTOR STRUCTURES

CROSS-REFERENCE TO RELATED APPLICATIONS

This application is a continuation application of International Patent Application No.: PCT/CN2021/076797, filed on Feb. 19, 2021, which claims priority to Chinese Patent Application No. 202010663754.0, entitled "METHOD FOR FORMING SELF-ALIGNED DOUBLE PATTERN AND SEMICONDUCTOR STRUCTURES" and filed on Jul. 10, 2020. The entire contents of International Patent Application No.: PCT/CN2021/076797 and Chinese Patent Application No. 202010663754.0 are incorporated herein by reference.

TECHNICAL FIELD

The present invention relates to the field of semiconductor fabrication, in particular to a method for forming a self-aligned double pattern and semiconductor structures.

BACKGROUND

Since a size of a semiconductor structure is gradually reduced with a development of a semiconductor technology, a pattern is likely difficult to define with a general photolithography method, and therefore, a Self-Aligned Double Patterning (SADP) technology is developed. In such a process, a mandrel and a spacer structure are formed in sequence, and after removal of the mandrel structure, a key size of a subsequent pattern is defined by the remaining spacer structure. This technology facilitates formation of a small-size pattern on a surface of the target semiconductor structure.

However, when manufactured with the SADP technology, the semiconductor structure often has asymmetric morphology, which significantly affects a yield of the semiconductor structure fabricated using the SADP technology.

SUMMARY

The present invention provides a method for forming a self-aligned double pattern and semiconductor structures, which may solve the problem of asymmetric morphology of a semiconductor structure when a semiconductor is fabricated using a SADP technology, and improve a yield of usage of the semiconductor structure.

In order to solve the above-mentioned problem, there is provided below a method for forming a self-aligned double pattern, including the following steps: providing a substrate; sequentially forming a first mask layer, a second mask layer and a third mask layer on an upper surface of the substrate, and etching downwards from an upper surface of the third mask layer in a direction perpendicular to the upper surface of the substrate until a first trench exposing an upper surface of the first mask layer is formed; removing the third mask layer, and partially removing the first mask layer, so as to deepen the first trench; forming a spacer layer on an inner wall of the first trench, and filling the first trench with a fourth mask layer; and partially removing the spacer layer to form a second trench exposing the substrate.

In order to solve the above-mentioned problem, there is further provided below a semiconductor structure including: a substrate; a first mask layer formed on the substrate, the first mask layer having alternate recesses and protrusions; a second mask layer formed on the protrusion of the first mask layer; and a spacer layer covering surfaces of the first mask layer and the second mask layer, the upper surface of the spacer layer located at a recess of the first mask layer being flush with a top surface of the protrusion of the first mask layer.

In order to solve the above-mentioned problem, there is further provided below a semiconductor structure for a SADP etching process, including: a substrate; and alternate first mask structures and second mask structures formed on an upper surface of the substrate, the first mask structure including a first mask layer and a second mask layer sequentially provided on the upper surface of the substrate, the second mask structure including a first mask layer, a spacer layer and a fourth mask layer sequentially provided on the upper surface of the substrate, and a second trench being formed between the adjacent first mask structure and second mask structure.

DESCRIPTION OF EMBODIMENTS

Research shows that, when a semiconductor structure is fabricated with a self-aligned double pattern technology in a prior art, asymmetric morphology of the semiconductor structure is caused by asymmetric morphology of a mandrel of a self-aligned double pattern used as a mask and fabricated with the self-aligned double pattern technology. The reason for the asymmetric morphology of the mandrel lies in that the mandrel of the self-aligned double pattern fabricated with a self-aligned double pattern method in the prior art has more than two materials in a horizontal direction. Thus, in a process of manufacturing the mandrel, etching gas or etching liquid has different etching selection ratios for different materials on a sidewall surface of the mandrel, such that the mandrel has poor morphology, and the sidewall surface of the mandrel is uneven, which directly influences the morphology of the semiconductor structure fabricated with the self-aligned double pattern as the mask, and directly reduces a yield of the semiconductor structure.

A method for forming a self-aligned double pattern and semiconductor structures are further explained and illustrated below in conjunction with the drawings.

Figure 1:
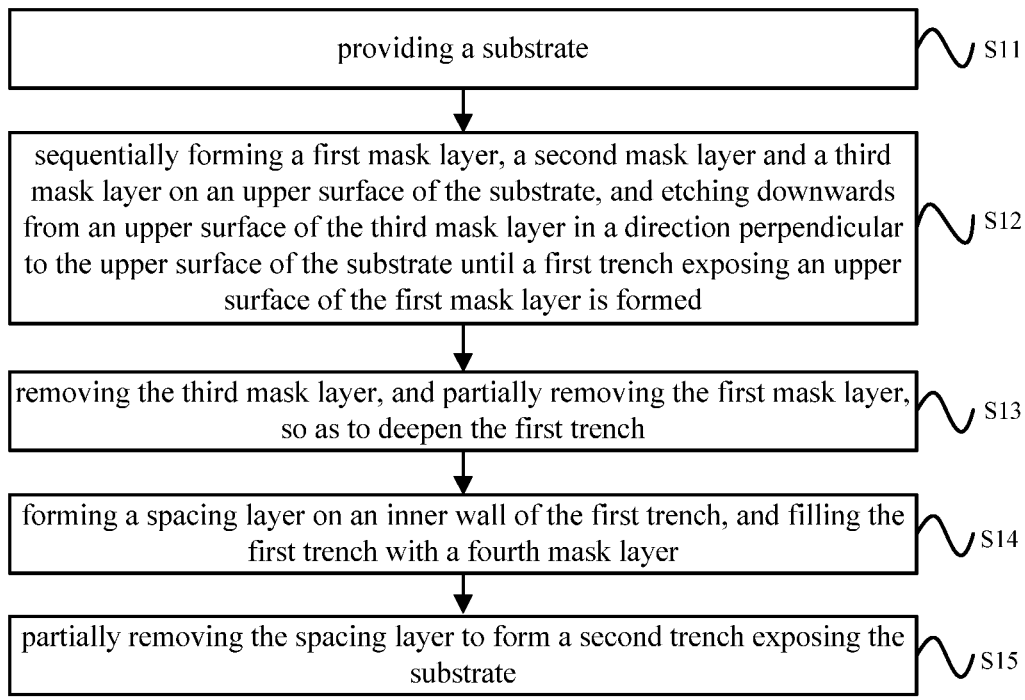
FIG. 1 is a schematic flow chart of steps of a method for forming a self-aligned double pattern according to an implementation of the present invention.

Reference is made to FIGS. 1 and 2A to 2I, with FIG. 1 being a schematic flow chart of steps of a method for forming a self-aligned double pattern according to an implementation of the present invention, and FIGS. 2A to 2I being schematic structural diagrams corresponding to the steps of the method for forming a self-aligned double pattern according to an implementation of the present invention.

In the implementation shown in FIGS. 1 and 2A to 2I, there is provided a method for forming a self-aligned double pattern, including the following steps: S11: providing a substrate 200; S12: sequentially forming a first mask layer 201, a second mask layer 202 and a third mask layer 204 on an upper surface of the substrate 200, referring to FIG. 2A, and etching downwards from an upper surface of the third mask layer 204 in a direction perpendicular to the upper surface of the substrate 200 until a first trench 206 exposing an upper surface of the first mask layer 201 is formed, referring to FIG. 2C; S13: removing the third mask layer 204, and partially removing the first mask layer 201, so as to deepen the first trench 206, referring to FIG. 2D; S14: forming a spacer layer 207 on an inner wall of the first trench 206, and filling the first trench 206 with a fourth mask layer 208, referring to FIG. 2G; and S15: partially removing the spacer layer 207 to form a second trench 213 exposing the substrate 200, referring to FIG. 2H.

Figure 2A:
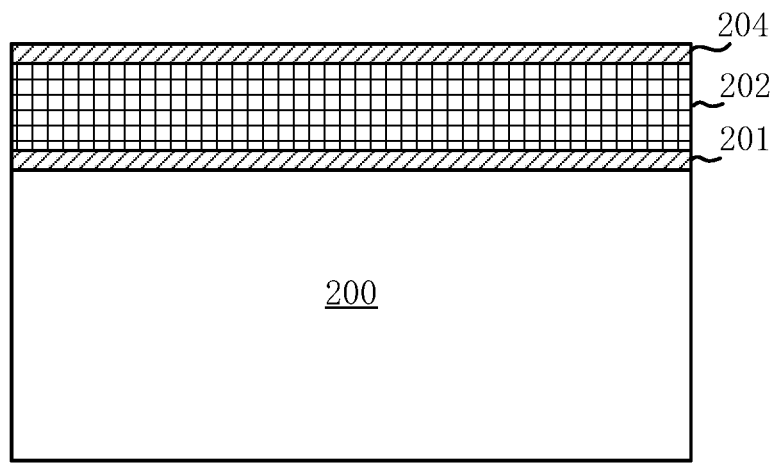
FIGS. 2A to 2I are schematic structural diagrams corresponding to the steps of the method for forming a self-aligned double pattern according to an implementation of the present invention.
Figure 2B:
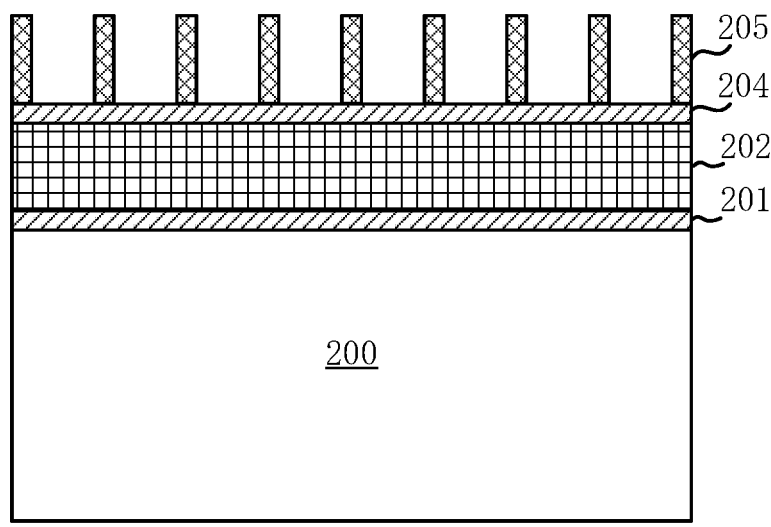
Figure 2C:
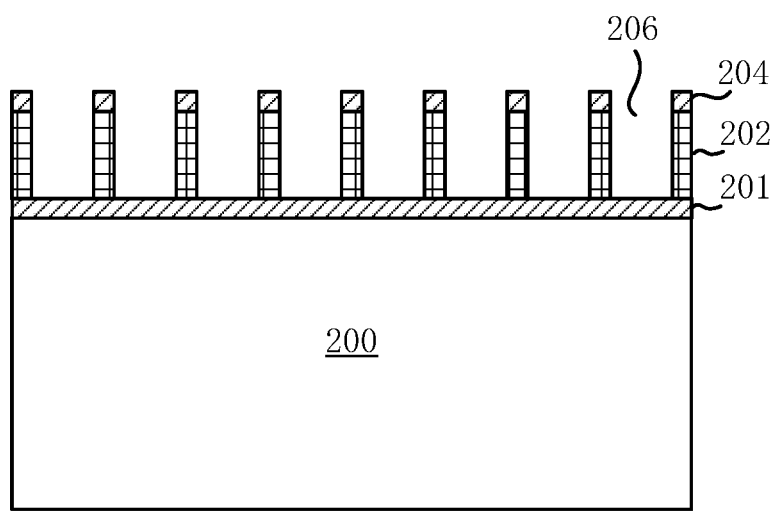
Figure 2D:
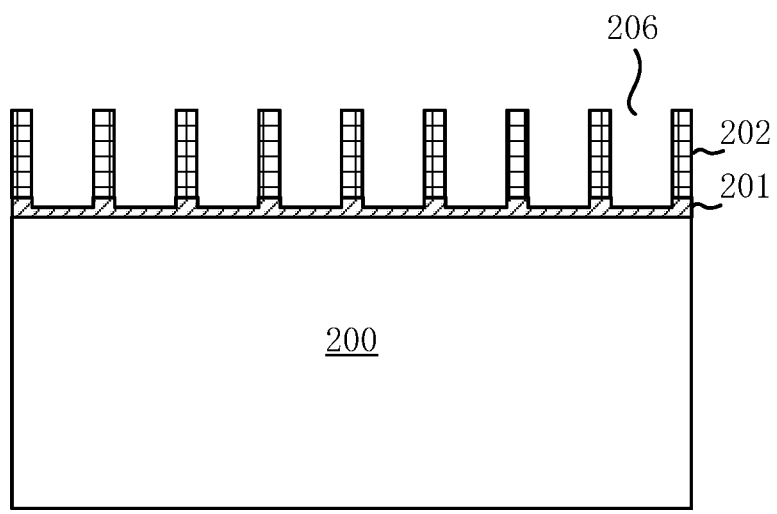
Figure 2E:
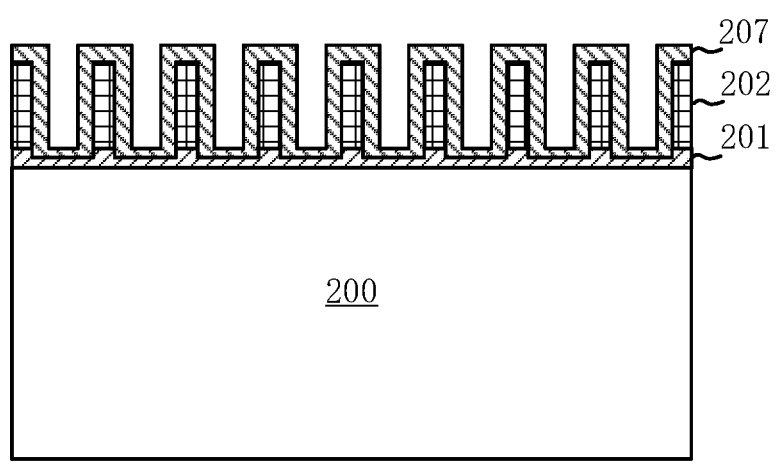
Figure 2F:
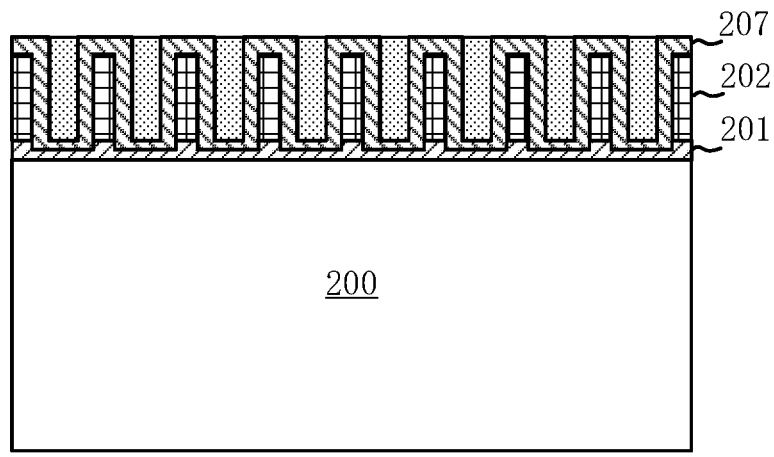
Figure 2G:
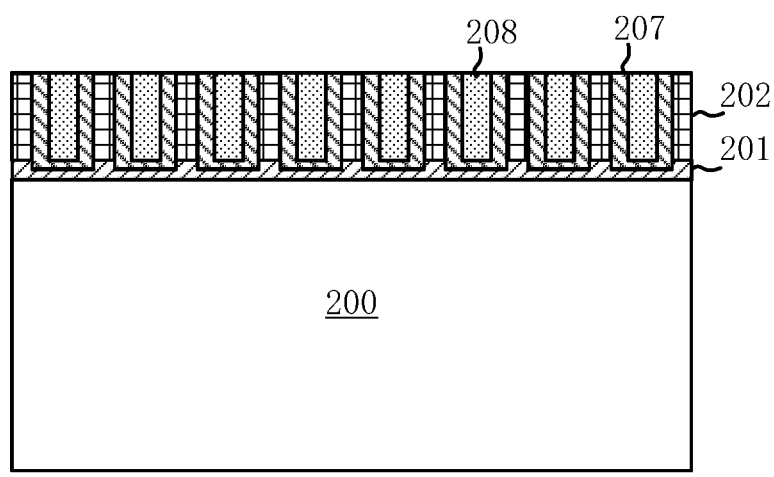
Figure 2H:
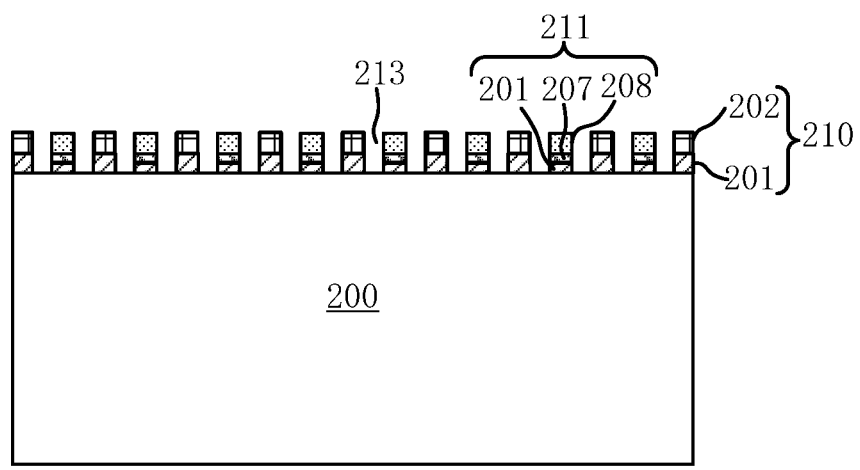
Figure 2I:
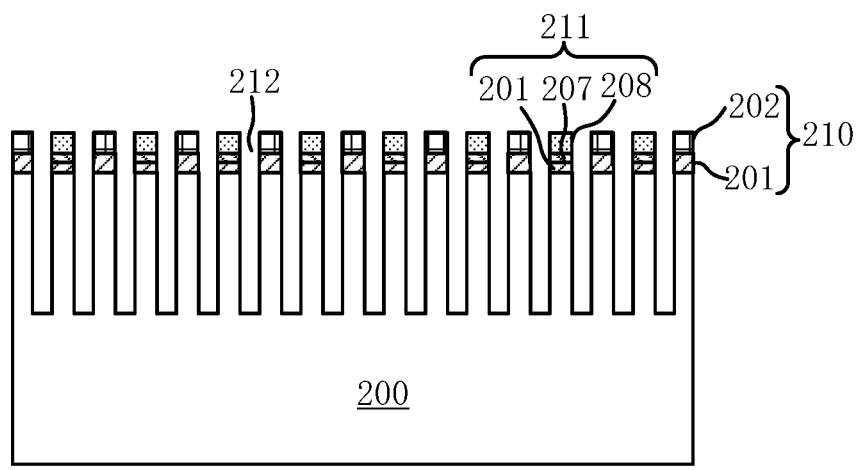

In this implementation, after formation of the second trench 213, a remaining structure on the upper surface of the substrate 200 constitutes a mandrel formed by the self-aligned double pattern method, and the mandrel functions as a mask to facilitate formation of a small-size isolation trench, or the like, on the substrate 200, referring to FIG. 2I.

In this implementation, the mandrel of the self-aligned double pattern formed with the method for forming the self-aligned double pattern has at most two materials at the same height, which guarantees form regularity of the mandrel, and may guarantee size uniformity of an isolation trench 212 formed on the upper surface of the substrate 200 when the self-aligned double pattern is used as the mask, thereby improving a yield of a semiconductor structure.

In one implementation, the first mask layer 201 includes a silicon oxynitride layer, the second mask layer 202 includes a hard mask composition layer, and the third mask layer 204 includes a silicon hydroxide layer. In practice, specific materials of the first mask layer 201, second mask layer 202 and third mask layer 204 may also be set as required.

In one implementation, a plurality of first trenches 206 exposing the upper surface of the first mask layer 201 are formed, and adjacent first trenches 206 have equal distances, referring to FIG. 2C. The self-aligned double pattern is used to form the isolation trench 212 on the surface of the substrate 200 (referring to FIG. 2I), and a number of the first trench 206 is related to a number of the isolation trench 212. Here, 2N isolation trenches 212 are required to be formed on the substrate 200, N being an integer greater than 0, and then, the number of the first trenches 206 is N.

In one implementation, during formation of the plurality of first trenches 206 exposing the upper surface of the first mask layer 201, the method includes the following steps: forming a patterned photoresist layer 205 on the upper surface of the third mask layer 204, referring to FIG. 2B; and directionally etching the third mask layers 204 and second mask layer 202 downwards along the upper surface of the third mask layer 204 until the upper surface of the first mask layer 201 is exposed, and then removing the photoresist layer 205, referring to FIG. 2C.

In this implementation, the first trench 206 is deepened during a subsequent processing process, such that a bottom surface of the first trench 206 is 2 nm to 10 nm lower than an original upper surface of the first mask layer 201. This is because a spacer layer 207 is further required to be deposited within the first trench 206 during formation of the self-aligned double pattern. The spacer layer 207 is formed on both a sidewall and the bottom surface of the first trench 206. When a top surface of the spacer layer 207 at the bottom surface of the first trench 206 is too high, higher than a top surface of the first mask layer 201, the self-aligned double pattern may have too many types (at least three types) of materials at the same height, which may easily affect the size uniformity of the final isolation trench 212.

In one implementation, the forming a spacer layer 207 on an inner wall of the first trench 206 and filling the first trench 206 with a fourth mask layer 208 includes: forming the spacer layer 207 covering surfaces of the first mask layer 201 and second mask layer 202, referring to FIG. 2E; filling the first trench 206 with the fourth mask layer 208, referring to FIG. 2F; and removing the spacer layer 207 higher than an upper surface of the second mask layer 202, and removing the fourth mask layer 208 higher than the upper surface of the second mask layer 202, such that the top surface of the spacer layer 207 is flush with the upper surface of the second mask layer 202 and an upper surface of the fourth mask layer 208, referring to FIG. 2G.

It should be noted that prior to formation of the structure shown in FIG. 2E, the third mask layer 204 located on the upper surface of the second mask layer 202 is removed, as well as a part of the upper surface of the first mask layer 201 exposed to the first trench 206, referring to FIG. 2D. At this point, the spacer layer 207 formed in the first trench 206 has a part located in the first trench 206 and having an upper surface flush with the upper surface of the first mask layer 201.

In one implementation, the forming the spacer layer 207 covering surfaces of the first mask layer 201 and second mask layer 202 includes: controlling the upper surface of the spacer layer 207 at a bottom of the first trench 206 to be flush with a bottom surface of the second mask layer 202. Thus, the final self-aligned double pattern may be guaranteed to have at most two materials at the same height, thereby guaranteeing the form regularity of the self-aligned double pattern and ensuring that the isolation trench 212, or the like, formed using the self-aligned double pattern, have better size uniformity.

It should be noted that since the fourth and second mask layers 208, 202 are required to be reserved when the spacer layer 207 is removed partially, a selected material of the spacer layer 207 is required to be distinguished from selected materials of the fourth mask layer 208 and second mask layer 202, and it is preferable that the spacer layer 207 has a higher etching selection ratio than the fourth mask layer 208 and second mask layer 202. During partial removal of the spacer layer 207, an adopted etching method should be a directional etching method, an etching direction being downward in a direction perpendicular to the upper surface of the substrate 200.

In one implementation, the spacer layer 207 includes a silicon oxide layer, and the fourth mask layer 208 includes a hard mask composition layer, and has the same material as the second mask layer 202. In practice, the specific materials of the spacer layer 207 as well as the fourth mask layer 208 and second mask layer 202 may be set according to specific requirements.

In one implementation, the filling the first trench 206 with the fourth mask layer 208 includes: controlling the upper surface of the fourth mask layer 208 to be flush with the upper surface of the spacer layer 207, referring to FIG. 2F, or higher than the upper surface of the spacer layer 207. When higher than the upper surface of the spacer layer 207, the upper surface of the fourth mask layer 208 is required to be polished, such that the upper surface of the fourth mask layer 208 is flush with the upper surface of the spacer layer 207, or the spacer layer 207 and the fourth mask layer 208 which are higher than the upper surface of the second mask layer 202 are simultaneously removed in a one-time polishing process.

In one implementation, the spacer layer 207 and the fourth mask layer 208 higher than the upper surface of the second mask layer 202 are removed with a chemical mechanical polishing technology, referring to FIG. 2G.

In another implementation, the upper surface of the spacer layer 207 is first polished to make the upper surface of the spacer layer 207 flush with the upper surface of the second mask layer 202, and then, the fourth mask layer 208 is filled, and the filled fourth mask layer 208 is chemically and mechanically polished to make a top surface of the fourth mask layer 208 flush with a top surface of the second mask layer 202, referring to FIG. 2G.

In one implementation, the first mask layer 201 is partially removed with at least one of dry and wet etching methods. In one implementation, the dry or wet etching method is a directional etching method.

In one implementation, the spacer layer 207 and the first mask layer 201 are partially removed to form the second trench 213 exposing the substrate 200, such that a first mask structure 210 and a second mask structure 211 are formed on the surface of the substrate 200; the first mask structure 210 includes the first mask layer 201 and the second mask layer 202, the second mask structure 211 includes the first mask layer 201, the spacer layer 207 and the fourth mask layer 208, and the first mask structure 210 and second mask structure 211 are arranged alternately.

Specifically, the spacer layer 207 growing on two sidewall surfaces of the first trench 206 is removed using the directional etching method, and when to be etched, the first mask layer 201 is continuously etched directionally until the upper surface of the substrate 200 is exposed.

At this point, it may be observed that the mandrel (including the first mask structure 210 and second mask structure 211) in the final self-aligned double pattern as shown in FIG. 2H has at most two materials on a horizontal plane at any height, which guarantees the form regularity of the mandrel of the self-aligned double pattern, may guarantee the size uniformity of the small-size structures, such as the isolation trench 212, or the like, when the small-size structures are fabricated on the upper surface of the substrate 200 using the self-aligned double pattern, and improves the yield of the semiconductor structure manufactured using the self-aligned double pattern technology.

In one implementation, the spacer layer 207 is formed with at least one of atomic layer deposition, chemical vapor deposition and physical vapor deposition.

In one implementation, the removing the third mask layer 204 and partially removing the first mask layer 201 includes: simultaneously introducing etching gas and protective gas to remove the third mask layer 204 and partially remove the first mask layer 201, the etching gas and the protective gas having a concentration ratio of 20:1-10:1.

In another implementation, the removing the third mask layer 204 and partially removing the first mask layer 201 includes: alternately introducing etching gas and protective gas to remove the third mask layer 204 and partially remove the first mask layer 201, the etching gas and the protective gas having an introduction duration ratio of 20:1-10:1.

In one implementation, the etching gas and the protective gas may be introduced simultaneously or alternately as desired. In practice, according to different requirements for a critical size, the protective gas and the etching gas may be introduced sequentially and then alternately.

In this implementation, the protective gas is introduced to protect the second mask layer 202 and thus the form thereof during removal of the first mask layer 201 and third mask layer 204.

In one implementation, the first mask layer 201 and third mask layer 204 are silicon oxynitride layers, and the etching gas includes $CF_4$, $CHF_3$, $CH_2F_2$, $CH_3F$, or the like, which may effectively remove silicon oxynitride. The second mask layer is a hard mask composition layer formed by SOC, and the protective gas includes chemical vapor deposition gas, such as $C_2H_6$, or the like, which may effectively protect a sidewall of a hard mask composition formed by the second mask layer 202.

In one implementation, after the forming a second trench 213 exposing the substrate 200, the method includes: removing a part of the substrate 200 with the first mask structures 210 and second mask structures 211 as masks, so as to form the isolation trench 212, referring to FIG. 2I. In some implementations, after formation of the structure shown in FIG. 2I, the method further includes the step of removing the first mask structure 210 and second mask structure 211.

Referring to FIG. 2E, there is further provided below a semiconductor structure including: a substrate 200; a first mask layer 201 formed on the substrate 200, the first mask layer 201 having alternate recesses and protrusions; a second mask layer 202 formed on the protrusion of the first mask layer 201; and a spacer layer 207 covering surfaces of the first mask layer 201 and second mask layer 202, the upper surface of the spacer layer 207 located at the recess of the first mask layer 201 being flush with a top surface of the protrusion of the first mask layer 201.

Such a semiconductor structure facilitates formation of the first mask structure 210 and second mask structure 211 having at most two materials at the same height, thereby easily forming the small-size structures, such as the isolation trench, or the like, on the substrate 200.

Referring to FIG. 2H, there is further provided below a semiconductor structure for a SADP etching process, including: a substrate 200; and alternate first mask structures 210 and second mask structures 211 formed on an upper surface of the substrate 200, the first mask structure 210 including a first mask layer 201 and a second mask layer 202 sequentially provided on the upper surface of the substrate 200, the second mask structure 211 including a first mask layer 201, a spacer layer 207 and a fourth mask layer 208 sequentially provided on the upper surface of the substrate 200, and a second trench 213 being formed between the adjacent first and second mask structures 210, 211.

In one implementation, a top surface of the spacer layer 207 in the second mask structure 211 is flush with a top surface of the first mask layer 201 in the first mask structure 210.

In this implementation, the first mask structure 210 and second mask structure 211 have at most two materials at the same height, which guarantees form regularity of a mandrel, and may guarantee size uniformity of an isolation trench 212 formed on the upper surface of the substrate 200 when the mandrel is used as a mask (referring to FIG. 2I), thereby improving a yield of the semiconductor structure.

Although the present invention has been disclosed as above in various embodiments, the present invention should not be limited by those embodiments. Those skilled in the art may make changes or modifications to the present invention based on the methods and technical solutions disclosed above without departing from the spirit and scope of the present invention. Therefore, any simple alterations, equivalent changes and modifications made to the foregoing embodiments based on the technical essence of the present invention without departing from the technical solutions proposed in the present invention are deemed to fall within the protection scope of the technical solutions in the present invention.

What is claimed is:
1. A method for forming a self-aligned double pattern, comprising the following steps:

providing a substrate;

sequentially forming a first mask layer, a second mask layer and a third mask layer on an upper surface of the substrate, forming a patterned photoresist layer on an upper surface of the third mask layer and etching downwards from an upper surface of the third mask layer in a direction perpendicular to the upper surface of the substrate until a first trench exposing an upper surface of the first mask layer is formed;

removing the patterned photoresist layer;

removing the third mask layer, and partially removing the first mask layer, so as to deepen the first trench and form alternate recesses and protrusions in the first mask layer, wherein the recesses located at a bottom of the first trench;

forming a spacer layer on an inner wall of the first trench, and filling the first trench with a fourth mask layer, wherein a top surface of the spacer layer at the recesses of the first mask layer is flush with a top surface of the protrusions of the first mask layer; and partially removing the spacer layer to form a second trench exposing the substrate.

2. The method for forming a self-aligned double pattern according to claim 1, wherein a plurality of first trenches exposing the upper surface of the first mask layer are formed, and adjacent first trenches have equal distances.

3. The method for forming a self-aligned double pattern according to claim 1, wherein a plurality of second trenches exposing the substrate are formed, and adjacent second trenches have equal distances.

4. The method for forming a self-aligned double pattern according to claim 1, wherein the forming a spacer layer on an inner wall of the first trench and filling the first trench with a fourth mask layer comprises:
  forming the spacer layer covering surfaces of the first mask layer and the second mask layer;
  filling the first trench with the fourth mask layer; and
  removing the spacer layer and the fourth mask layer higher than an upper surface of the second mask layer, such that a top surface of the spacer layer is flush with the upper surface of the second mask layer and an upper surface of the fourth mask layer.

5. The method for forming a self-aligned double pattern according to claim 4, wherein the filling the first trench with the fourth mask layer comprises: controlling the upper surface of the fourth mask layer to be flush with the upper surface of the spacer layer or higher than the upper surface of the spacer layer.

6. The method for forming a self-aligned double pattern according to claim 1, wherein the spacer layer and the first mask layer are partially removed to form the second trench exposing the substrate, such that a first mask structure and a second mask structure are formed on the upper surface of the substrate; and the first mask structure comprises the first mask layer and the second mask layer, the second mask structure comprises the first mask layer, the spacer layer and the fourth mask layer, and the first mask structures and the second mask structures are arranged alternately.

7. The method for forming a self-aligned double pattern according to claim 4, wherein the removing the spacer layer and the fourth mask layer higher than an upper surface of the second mask layer comprises:
  removing the spacer layer and the fourth mask layer higher than the upper surface of the second mask layer with a chemical mechanical polishing technology.

8. The method for forming a self-aligned double pattern according to claim 1, wherein the spacer layer is formed with at least one of atomic layer deposition, chemical vapor deposition and physical vapor deposition.

9. The method for forming a self-aligned double pattern according to claim 1, wherein the partially removing the first mask layer comprises:
  partially removing the first mask layer to deepen the first trench by 2 nm to 10 nm.

10. The method for forming a self-aligned double pattern according to claim 1, wherein the removing the third mask layer and partially removing the first mask layer comprises:
  simultaneously introducing etching gas and protective gas to remove the third mask layer and partially remove the first mask layer, the etching gas and the protective gas having a concentration ratio of 20:1-10:1.

11. The method for forming a self-aligned double pattern according to claim 1, wherein the removing the third mask layer and partially removing the first mask layer comprises:
  alternately introducing etching gas and protective gas to remove the third mask layer and partially remove the first mask layer, the etching gas and the protective gas having an introduction duration ratio of 20:1-10:1.

12. The method for forming a self-aligned double pattern according to claim 6, after the forming a second trench exposing the substrate, comprising:
  removing a part of the substrate with the first mask structure and the second mask structure as masks, so as to form an isolation trench.

13. The method for forming a self-aligned double pattern according to claim 1, wherein the first mask layers (201) and third mask layers (204) are silicon oxynitride layers, the second mask layer is a hard mask composition layer formed by spin-on-carbon (SOC).

14. The method for forming a self-aligned double pattern according to claim 10, wherein the etching gas includes $CF_4$, $CHF_3$, $CH_2F_2$ or $CH_3F$, and the protective gas includes $C_2H_6$.

15. The method for forming a self-aligned double pattern according to claim 11, wherein the etching gas includes $CF_4$, $CHF_3$, $CH_2F_2$ or $CH_3F$, and the protective gas includes $C_2H_6$.

* * * * *